United States Patent
Hur et al.

(10) Patent No.: US 9,275,574 B2
(45) Date of Patent: Mar. 1, 2016

(54) ORGANIC LIGHT EMITTING DIODE DISPLAY

(71) Applicant: Samsung Display Co., Ltd., Yongin, Gyeonggi-Do (KR)

(72) Inventors: Rog Hur, Yongin (KR); Won-Sup Choi, Yongin (KR); Sun-Sang Hwang, Yongin (KR); Beom-Seok Cha, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 129 days.

(21) Appl. No.: 13/948,405

(22) Filed: Jul. 23, 2013

(65) Prior Publication Data

US 2014/0284562 A1    Sep. 25, 2014

(30) Foreign Application Priority Data

Mar. 25, 2013    (KR) ........................ 10-2013-0031577

(51) Int. Cl.
  *G09G 3/32*    (2006.01)
  *H01L 27/32*   (2006.01)
  *H05K 3/36*    (2006.01)

(52) U.S. Cl.
  CPC .......... *G09G 3/3208* (2013.01); *H01L 27/3276* (2013.01); *H01L 27/3288* (2013.01); *H01L 27/3297* (2013.01); *H05K 3/361* (2013.01); *H05K 2203/049* (2013.01)

(58) Field of Classification Search
  CPC .............. G09G 3/2092; G09G 3/2096; G09G 2300/0421; G09G 2300/0426; H01L 27/3276; H01L 27/3288; H01L 27/3297; H01L 51/5203; H01L 2224/48091; H01L 2924/00014; H01B 7/08–7/0892; H05K 3/361; H05K 3/328; H05K 3/4092; H05K 2201/0394; H05K 2201/0397; H05K 2201/10659; H05K 2203/049
  USPC ........... 345/82, 83; 174/110 R, 113 R–113 C, 174/261–267
  See application file for complete search history.

(56) References Cited

U.S. PATENT DOCUMENTS

| | | | | |
|---|---|---|---|---|
| 5,488,394 | A | * | 1/1996 | Sedberry .................... 346/141 |
| 6,040,984 | A | * | 3/2000 | Hirakawa .................... 174/261 |
| 6,407,508 | B1 | * | 6/2002 | Kawada et al. ............... 345/205 |
| 2008/0083554 | A1 | * | 4/2008 | Biskeborn et al. ......... 174/117 F |
| 2009/0078966 | A1 | * | 3/2009 | Asai et al. .................... 257/194 |

(Continued)

FOREIGN PATENT DOCUMENTS

| KR | 1020060037728 A | 5/2006 |
|---|---|---|
| KR | 1020060043889 A | 5/2006 |

(Continued)

*Primary Examiner* — Nathan Danielsen
(74) *Attorney, Agent, or Firm* — Robert E. Bushnell, Esq.

(57) ABSTRACT

An organic light emitting diode (OLED) display that includes a panel assembly outputting an image, an electrode part formed at one side of the panel assembly, and a connection member connected to the electrode part, wherein the connection member includes a body part having a plane shape, a plurality of first electrode lines and a plurality of second electrode lines extending in a longitudinal direction, being wire bonded to the electrode part, spaced apart from one another in a lateral direction in an alternating manner and electrically connecting an external device to the panel assembly.

20 Claims, 5 Drawing Sheets

(56) References Cited

U.S. PATENT DOCUMENTS

2010/0007596 A1* 1/2010 Cho et al. ............... 345/98
2010/0097550 A1* 4/2010 Yamaguchi et al. ....... 349/115

FOREIGN PATENT DOCUMENTS

| KR | 1020070113917 A | 11/2007 |
|----|-----------------|---------|
| KR | 1020090045536 A | 5/2009  |

* cited by examiner

ORGANIC LIGHT EMITTING DIODE DISPLAY

This application makes reference to, incorporates the same herein, and claims all benefits accruing under 35 U.S.C. §119 from an application earlier filed in the Korean Intellectual Property Office filed on Mar. 25, 2013 and there duly assigned Serial No. 10-2013-0031577.

BACKGROUND OF THE INVENTION

1. Field of the Invention

The present invention relates to an organic light emitting diode (OLED) display outputting an image.

2. Description of the Related Art

A display apparatus including an organic light emitting element (an organic light emitting diode) as a self-emissive element has a wide viewing angle, excellent contrast, excellent luminance, an excellent driving voltage, and a fast response speed characteristic.

An organic light emitting diode (OLED) display including the above organic light emitting element includes a panel assembly and a data pad transmitting data to the panel assembly.

As the organic light emitting diode (OLED) display is changed from high density (HD) to full high density (FHD) and from FHD to ultra-high density (UHD) such that resolution is increased, miniaturization of electrodes forming the data pad is required.

However, to realize the miniaturization of the data pad in the conventional organic light emitting diode (OLED) display, additional investment in equipment and new equipment development are required. Accordingly, to manufacture an organic light emitting diode (OLED) display with high resolution, manufacture cost is increased.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention provides an organic light emitting diode (OLED) display realizing a fine pitch without increasing manufacturing cost even though resolution is increased.

According to one aspect of the present invention, there is provided an organic light emitting diode (OLED) display that includes a panel assembly outputting an image, an electrode part arranged at one side of the panel assembly and connection member connected to the electrode part, wherein the connection member may include a body part having a plane shape, a plurality of first electrode lines arranged on the body part and spaced-apart from each other by a first predetermined interval, and a plurality of second electrode lines arranged on the body part and spaced apart from each other by a second predetermined interval, arranged under the first electrode lines, being insulated from the first electrode lines, and having one end connected to the panel assembly and extending further toward the panel assembly than the first electrode lines.

The plurality of second electrode lines may be respectively arranged between the plurality of first electrode lines. The first predetermined interval may be the same as the second predetermined interval. Each of the first electrode lines may be respectively positioned at a center between two neighboring second electrode lines, and each of the plurality of second electrode lines may be respectively positioned at a center between two neighboring first electrode lines. The connection member may be a flexible printed circuit (FPC) of a dual structure including an inner metal layer and an outer metal layer, and the plurality of first electrode lines may be the outer metal layer and the plurality of second electrode lines may be the inner metal layer.

The OLED display may also include a main board transmitting an electrical signal to the panel assembly and the connection member may be a tape carrier package (TCP) conveying electrical signals between the panel assembly and the main board. The connection member may be a chip on film (COF). The first and second predetermined intervals may be 80 microns. A lateral distance between each first electrode line and neighboring second electrode lines on either side of the first electrode line may be 40 microns. The first and second electrode lines may be wire bonded to the electrode part. A wire connecting one of the first electrode lines may be arranged half way between two wires connecting two neighboring second electrode lines respectively to the electrode part. The plurality of second electrode lines may be spaced apart from the plurality of first electrode lines in a vertical direction. The body may be comprised of an electrical insulator and spaces apart the plurality of second electrode lines from the plurality of first electrode lines in the vertical direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
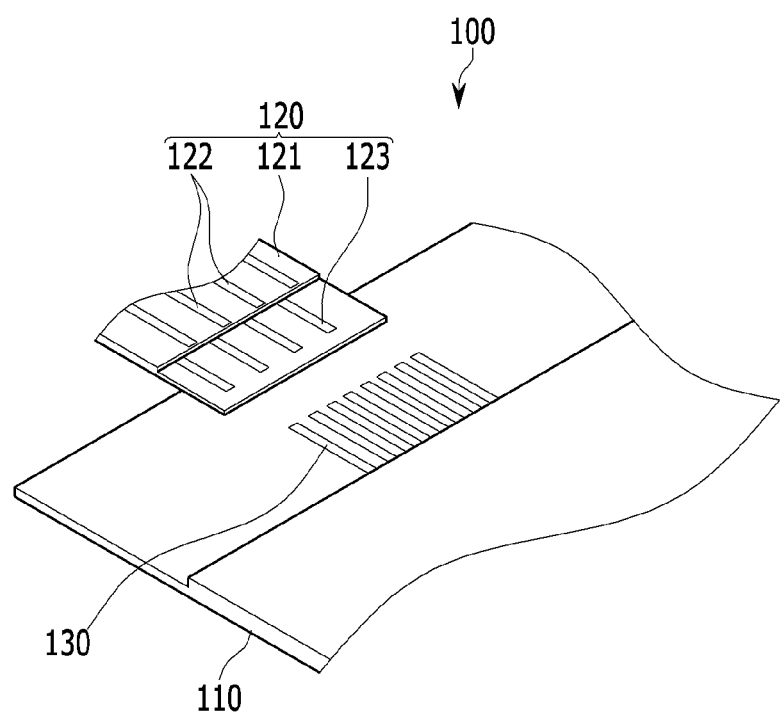
FIG. 1 is a perspective view of an organic light emitting diode (OLED) display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments of the present invention, detailed description is given for constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 2:
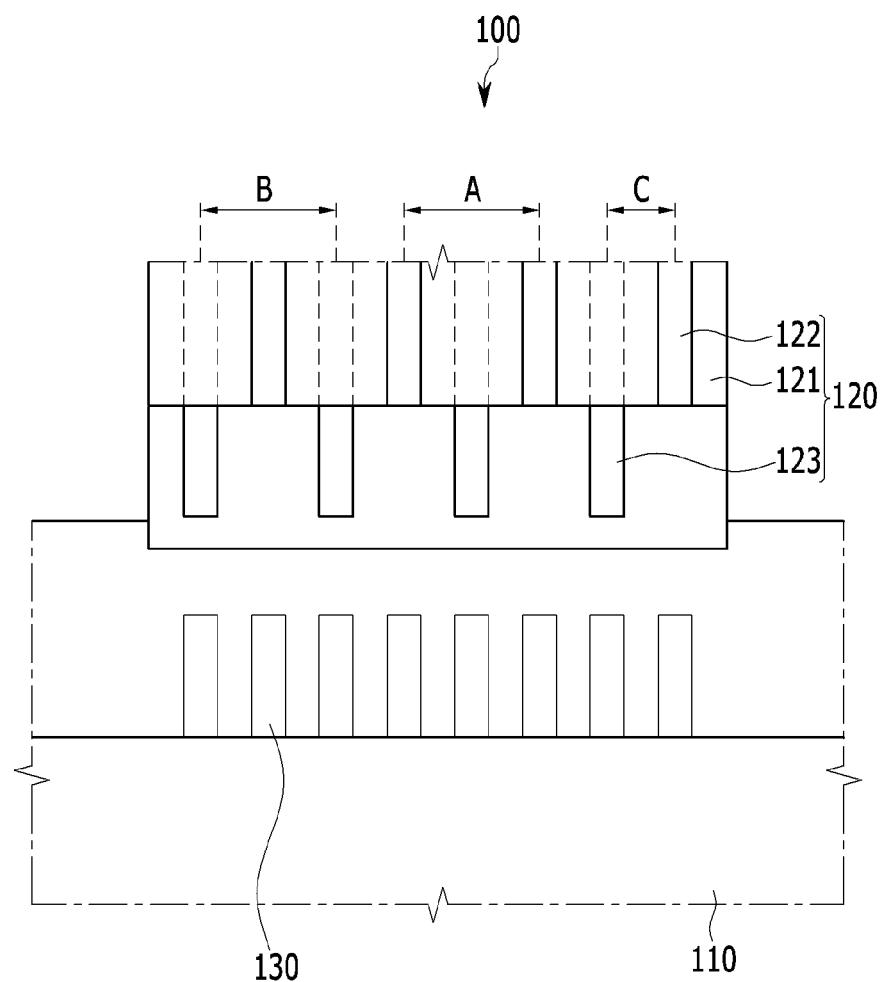
FIG. 2 is a plane view of an organic light emitting diode (OLED) display according to an exemplary embodiment of the present invention shown in FIG. 1.

FIG. 1 is a perspective view of an organic light emitting diode (OLED) display according to an exemplary embodiment of the present invention, and FIG. 2 is a plane view of an organic light emitting diode (OLED) display according to an exemplary embodiment of the present invention shown in FIG. 1.

Referring to FIG. 1, an organic light emitting diode (OLED) display 100 according to an exemplary embodiment of the present invention includes a panel assembly 110, an electrode part 130, and a connection member 120.

The panel assembly 110 outputs an image. The panel assembly 110 includes an organic light emitting element (not illustrated). The organic light emitting element may be formed by being patterned in the panel assembly 110. The panel assembly 110 may include a lower substrate and an upper substrate (not illustrated). The organic light emitting element may be formed on the lower substrate, and the upper substrate may encapsulate the organic light emitting element formed on the lower substrate. The upper substrate may be combined with the lower substrate by a sealant and having a predetermined interval therebetween.

The electrode part 130 is formed at one side of the panel assembly 110. The electrode part 130 allows electrical signals to be transmitted between the panel assembly 110 and other electrical parts. In FIG. 1, the electrode part 130 includes a plurality of electrodes, however the electrode part 130 is not limited to include the electrodes. This electrode part 130 may be a gate driving IC or a data driving IC, for example. The electrode part 130 may be formed on the lower substrate (not illustrated) of the panel assembly 110.

The data driving IC receives image data from the outside to generate and supply a data signals corresponding to a pixel to a data line (not illustrated) of the panel assembly 110. The gate driving IC generates and supplies the gate signal to drive the pixels of the panel assembly 110. These data driving IC and gate driving IC may be a data driving IC and a gate driving IC of general display panels, and as a result a detailed description thereof is omitted.

The connection member 120 is connected to the electrode part 130. In the organic light emitting diode (OLED) display 100 according to an exemplary embodiment of the present invention, the connection member 120 includes a body part 121, a plurality of first electrode lines 122, and a plurality of second electrode lines 123.

The body part 121 becomes a body of the connection member 120 and may have a plane shape. The plurality of first electrode lines 122 and the plurality of second electrode lines 123 are formed on the body part 121. The body part 121 may be made out of one of a plastic, a complex resin, or a transparent film, however it is not limited thereto, as any appropriate material to deposit the plurality of first electrode lines 122 and the plurality of second electrode lines 123 thereon may be used.

The first electrode lines 122 are formed on the body part 121. The first electrode lines 122 are formed to be separated by a predetermined interval. The first electrode lines 122 are electrically connected to the electrode part 130 formed at one side of the panel assembly 110 by bonding. Accordingly, electrical signals may be transmitted from an outside to the panel assembly 110 via the first electrode lines 122.

The second electrode lines 123 are formed on the body part 121. The second electrode lines 123 are insulated from the first electrode lines 122 and are formed under the first electrode lines 122. That is, the second electrode lines 123 and the first electrode lines 122 are sequentially formed on the body part 121.

A plurality of second electrode lines 123 are formed to be separated from each other by a predetermined interval. As opposed to the first electrode lines, one end of each second electrode line 123 connected to the panel assembly 110 is formed to be extended toward the panel assembly 110.

In detail, one end of each first electrode line 122 and each second electrode line 123 is electrically connected to the electrode part 130 by bonding. Here, one end of the second electrode line 123 may be further towards the panel assembly than the first electrode lines 122. That is, one end of each second electrode line 123 may be positioned closer to the electrode part 130 than one end of each first electrode line 122.

Meanwhile, the connection member 120 made out of the above structure may be a flexible printed circuit (FPC) of a dual-layered structure. The flexible printed circuit (FPC) of the dual-layered structure includes an inner layer metal and an outer layer metal. Although not shown, an insulation layer may be formed between the inner layer metal and the outer layer metal. That is, the inner layer metal and the outer layer metal are not connected to each other.

Here, in the connection member 120 included in the organic light emitting diode (OLED) display 100 according to an exemplary embodiment of the present invention, the first electrode lines 122 may be the outer layer metal and the second electrode lines 123 may be the inner layer metal.

This flexible printed circuit (FPC) may be the data pad of the organic light emitting diode (OLED) display 100. For example, when the electrode part 130 formed at one side of the panel assembly 110 may be a data driving IC, the connection member 120 may be a data pad connected to the data driving IC. The data pad is connected to the data driving IC by bonding to transmit the electrical signal to the data driving IC.

Meanwhile, referring to a detailed structure of the connection member 120, a plurality of second electrode lines 123 may be respectively positioned in an alternating manner between adjacent ones of the plurality of first electrode lines 122. That is, a plurality of second electrode lines 123 may be formed to not respectively overlap a plurality of first electrode lines 122 in a vertical direction. Accordingly, in the process of connecting the connection member 120 to the electrode part 130 by wire bonding, bonding wires connecting the first electrode lines 122 and the electrode part 130 may be prevented from being interfered with by bonding wires connecting the second electrode lines 123 to the electrode part 130.

Meanwhile, a separation distance A between adjacent ones of the plurality of first electrode lines 122 may be the same as a separation distance B between adjacent ones of the plurality of second electrode lines 123. For example, if the separation distance A between adjoining ones of the plurality of first electrode lines 122 is about 100 μm, then the separation distance B between adjoining ones of the plurality of second electrode lines 123 may also be about 100 μm. Similarly, if the separation distance A between neighboring ones of the plurality of first electrode lines 122 is about 80 μm, then the separation distance B between neighboring ones of the plurality of second electrode lines 123 may also be about 80 μm.

The plurality of first electrode lines 122 are respectively positioned half way between two adjacent second electrode lines 123, and a plurality of second electrode lines 123 are respectively positioned half way between two adjacent first electrode lines 122. In detail, before bonding the connection member 120 to the panel assembly 110, a process of aligning them to a reference position may be performed. According to this structure, in the bonding process to connect the connection member 120 to the electrode part 130, a defect due to an alignment error may be minimized.

As described above, each first electrode line 122 may be arranged half way between two neighboring second electrode lines 123 positioned at the right side and the left side, so that the first electrode line 122 is situated as far away as possible from the two adjacent second electrode lines 123. Consequently, the separation distance between the second electrode line 123 positioned at the right side of the one first electrode line 122 is the same as the separation distance from the second electrode line 123 positioned at the left side of one first electrode line 122. Accordingly, even though the alignment error is slightly generated, the first electrode line 122 to be connected to the predetermined part of the electrode part 130 may be prevented from being connected to any second electrode line 123.

Also, by uniformly maintaining the interval of the first electrode line 122 and the second electrode line 123 forming the connection member 120, wire design of the connection member 120 may be easily performed.

Meanwhile, in the organic light emitting diode (OLED) display 100 according to an exemplary embodiment of the present invention, the separation distance A of the plurality of first electrode lines 122 forming the connection member 120 is formed at 80 μm and the separation distance B of a plurality of second electrode lines 123 is formed at 80 μm. Also, second electrode lines 123 are respectively positioned at the direct center between a plurality of first electrode lines 122. Accordingly, the distance C between the first electrode line 122 and the second electrode line 123 may be 40 μm.

Alternatively, the separation distance A of a plurality of first electrode lines 122 forming the connection member 120 may be 60 μm and the separation distance B of a plurality of second electrode lines 123 may also be 60 μm. Also, second electrode lines 123 are respectively positioned at the direct center (i.e. half way between) between neighboring ones of the plurality of first electrode lines 122. Accordingly, the distance C between the first electrode line 122 and the second electrode line 123 may be 30 μm.

That is, in the organic light emitting diode (OLED) display 100 according to an exemplary embodiment of the present invention, the connection member 120 is formed with the dual-layered structure including the first electrode lines 122 and the second electrode lines 123. Accordingly, without additional circuit manufacturing equipment to realize the miniaturization, a connection member 120 realizing a fine pitch of less than 40 μm may be easily manufactured by using general circuit manufacturing equipment.

Figure 3:
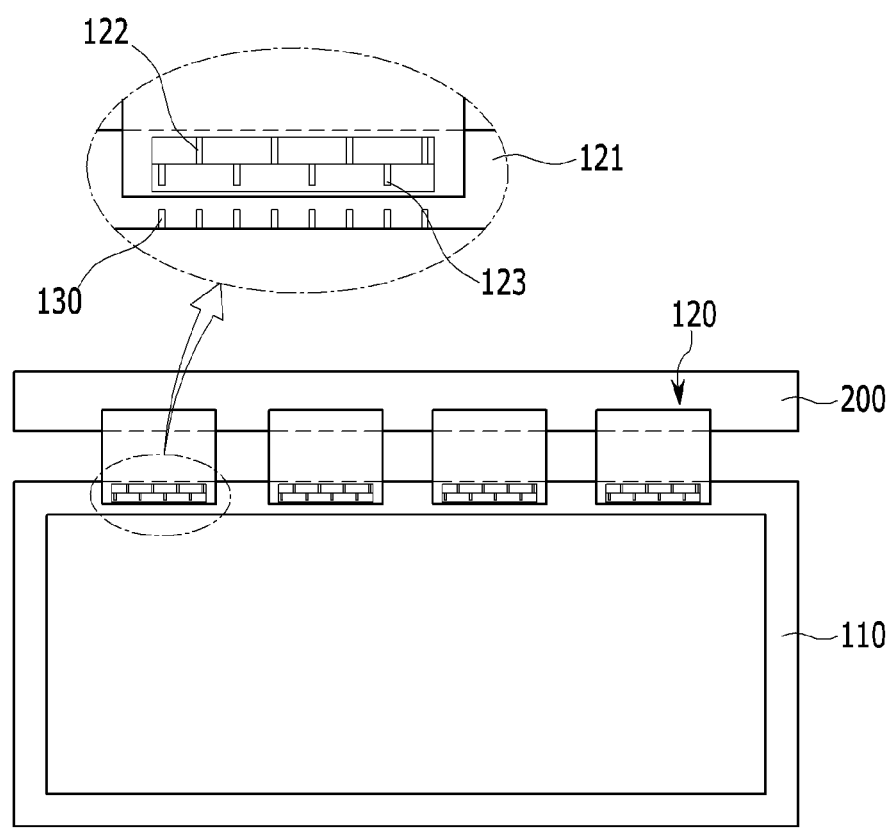
FIG. 3 is a plane view of an organic light emitting diode (OLED) display including a TCP applied with a structure of the connection member shown in FIG. 1.
Figure 4:
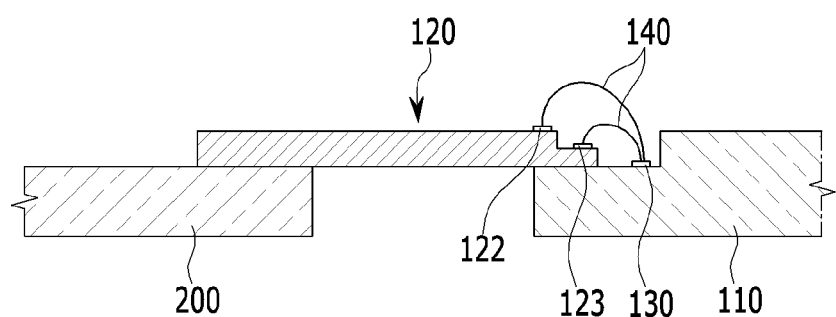
FIG. 4 is a lateral view of an organic light emitting diode (OLED) display including the TCP shown in FIG. 3.

Turning now to FIGS. 3 and 4, FIG. 3 is a plane view of an organic light emitting diode (OLED) display including a TCP applied with a structure of the connection member shown in FIG. 1, and FIG. 4 is a lateral view of an organic light emitting diode (OLED) display including the TCP shown in FIG. 3.

Referring to FIG. 3 and FIG. 4, the organic light emitting diode (OLED) display 100 according to an exemplary embodiment of the present invention may include a main board 200. The main board 200 may transmit electrical signals to the panel assembly 110 and may be arranged at the side of the panel assembly 110. Alternatively, the main board 200 may instead be disposed under the panel assembly 110.

One example of applying the connection member 120 included in the organic light emitting diode (OLED) display 100 according to an exemplary embodiment of the present invention may be a tape carrier package (TCP). The TCP allows transmitting of electric signals between the panel assembly 110 and the main board 200. The TCP is formed of the dual-layered structure including the first electrode lines 122 and the second electrode lines 123, as described above. Accordingly, although the organic light emitting diode (OLED) display 100 has high resolution such that the electrode part 130 is miniaturized, the miniaturization of the TCP may be easily realized without additional manufacturing equipment.

Also, another example of applying the connection member 120 of the dual layered structure may be a chip on film (COF) (not illustrated). Again referring to FIG. 2, the chip on film (not illustrated) is formed of the dual-layered structure including the first electrode line 122 and the second electrode line 123. The chip on film is a flexible printed circuit film. The chip on film is formed to be mounted directly on a glass substrate of the panel assembly 110. The chip on film connects the non-illustrated main board and the panel assembly 110. For example, when the main board 200 is positioned under the panel assembly 110, one end of the chip on film is mounted at the edge of the panel assembly 110 and a center portion of the chip on film is bent and the other end thereof is connected to the main board 200. Accordingly, although the organic light emitting diode (OLED) display 100 has high resolution such that the electrode part 130 is miniaturized, and the miniaturization of the chip on film corresponding thereto may be easily realized.

As described above, the dual layered circuit of the connection member 120 according to the organic light emitting diode (OLED) display 100 according to an exemplary embodiment of the present invention may be applied to the data pad and may be applied to the chip on film.

Figure 5:
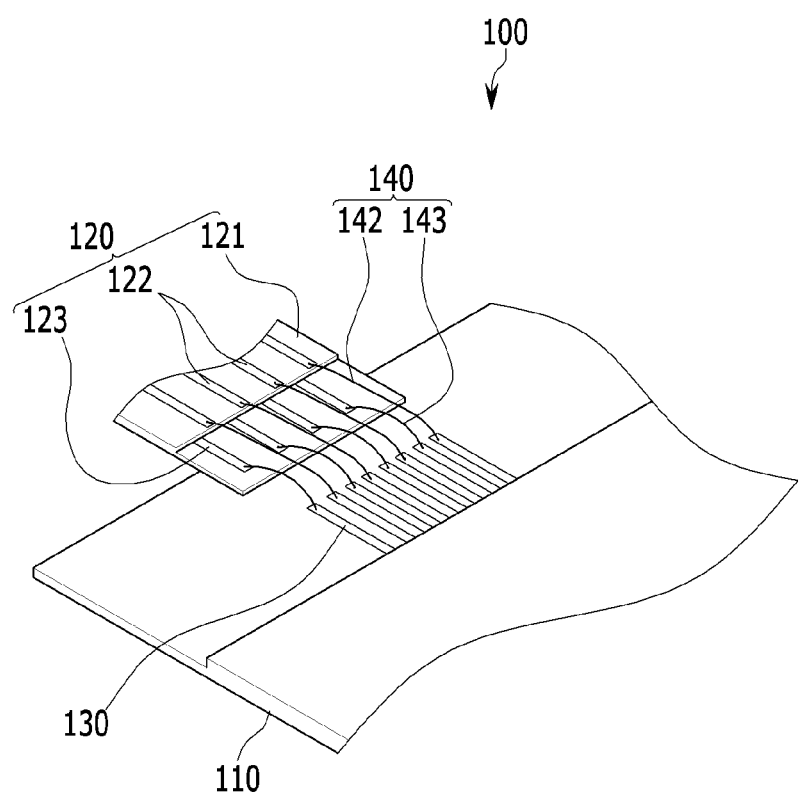
FIG. 5 is a view of the OLED display of FIG. 1 illustrating the wire binding 140 used to connect the connection member to the electrode part.

Turning now to FIG. 5, FIG. 5 is a view of the OLED display of FIG. 1 illustrating the wire bonding 140 used to connect the connection member 120 to the electrode part 130. As illustrated in FIG. 5, first bonding wires 142 electrically connect first electrode lines 122 to corresponding electrode parts 130. Second bonding wires 123 electrically connect second electrode lines 123 two corresponding electrode parts 130. As illustrated in FIG. 5, first and second bonding wires 142 and 143 are arranged in an alternating manner to correspond to the fact that the first and second electrode lines 122 and 123 are arranged in an alternating manner in the lateral direction. Because the second electrode lines 123 project further towards electrode part 130 than the first electrode lines 122, the bonding wires 142 and 143 do not interfere with one another, and can adequately connect each of the first and second electrode lines 122 and 123 to the electrode part 130, even though the spacing therebetween is relatively small and may only be 30 or 40μ.

The connection member 120 is formed of the dual-layered structure including the first electrode lines 122 and the second electrode lines 123 such that the connection member 120 may be easily manufactured by general circuit manufacturing equipment.

Therefore, by applying the described structure of the connection member 120 to the data pad or the chip on film, although the resolution of the organic light emitting diode (OLED) display 100 is increased, the data pad or the chip on film of the miniaturized structure corresponding to the panel assembly 110 of high resolution may be easily manufactured by using conventional equipment without additional investment or equipment development to obtain the manufacturing equipment for realizing the miniaturization.

The drawings and the detailed description described above are examples for the present invention and are provided to explain the present invention, and the scope of the present invention described in the claims is not limited thereto. Therefore, it will be appreciated to those skilled in the art that various modifications can be made and other equivalent embodiments are available. Accordingly, the actual scope of the present invention must be determined by the spirit of the appended claims.

DESCRIPTION OF THE SYMBOLS IN THE DRAWINGS

100: organic light emitting diode (OLED) display
110: panel assembly
120: connection member
121: body part
122: first electrode line
123: second electrode line
130: electrode part
140 wire bond
200: main board

What is claimed is:

1. An organic light emitting diode (OLED) display device, comprising:
a panel assembly outputting an image;
an electrode part arranged at one side of the panel assembly; and
a connection member connected to the electrode part, wherein the connection member includes:
a body part having a plane shape,
a plurality of first electrode lines arranged on the body part and spaced-apart from each other by a first predetermined interval, and
a plurality of second electrode lines arranged on the body part and spaced apart from each other by a second predetermined interval, arranged under the first electrode lines, being insulated from the first electrode lines, and having one end connected to the panel assembly and extending further toward the panel assembly than the first electrode lines, wherein each of the first and second electrode lines are wire bonded to the electrode part.

2. The OLED display device of claim 1, wherein the plurality of second electrode lines are respectively arranged between the plurality of first electrode lines.

3. The OLED display device of claim 1, wherein the first predetermined interval is the same as the second predetermined interval and is 80 μm.

4. The OLED display device of claim 1, wherein each of the first electrode lines are respectively positioned at a center between two neighboring second electrode lines, and
each of the plurality of second electrode lines are respectively positioned at a center between two neighboring first electrode lines.

5. The OLED display device of claim 1, wherein the connection member is a flexible printed circuit (FPC) of a dual structure including an inner metal layer and an outer metal layer, the inner metal layer being a metal layer having the body part arranged both above and below portions of the inner metal layer at locations on the connection member in between opposite ends of the connection member, and the outer metal layer being another metal layer having the body part arranged only underneath and not on top side thereof for an entirety of the connection member, and
the plurality of first electrode lines being the outer metal layer and the plurality of second electrode lines being the inner metal layer.

6. The OLED display device of claim 1, further comprising a main board transmitting an electrical signal to the panel assembly, and
the connection member being a data pad conveying electrical signals between the panel assembly and the main board, the connection member having a first end opposite a second end, the first end being attached to the panel assembly and the second end opposite end being attached to the main board.

7. The OLED display device of claim 1, the connection member being selected from a group consisting of a chip on film (COF) and a tape carrier package (TCP).

8. The °LED display device of claim 1, wherein each of the first and second predetermined intervals are 60 μm, wherein a lateral distance between each first electrode line and neighboring second electrode lines on either side of the first electrode line is 30 μm.

9. The OLED display device of claim 1, wherein a bonding wire connecting, one of the first electrode lines is arranged half way between two bonding wires connecting two neighboring second electrode lines respectively to the electrode part.

10. The OLED display device of claim 1, wherein the plurality of second electrode lines are spaced apart from the plurality of first electrode lines in a vertical direction.

11. The OLED display device of claim 1, wherein the body is comprised of an electrical insulator and spaces apart the plurality of second electrode lines from the plurality of first electrode lines in a vertical direction.

12. The OLED display device of claim 1, the electrode part being selected from a group consisting of a data driving IC and a gate driving IC.

13. The OLED display device of claim 1, the connection member being a data pad, the electrode part being a data driving IC.

14. The OLED display device of claim 1, a first end of the connection member being directly attached the panel assembly, the connection member further comprising a second and opposite end that is directly attached to the main board.

15. The OLED display device of claim 1, the body part comprising a first layer and a second layer portion, the first layer being arranged between the first and second electrode lines, the second layer being arranged beneath each of the first and second electrode lines, the first layer being absent from a first end of the connection member to expose the one end of the second electrode lines at a top side of the connection member.

16. The OLED display device of claim 1, wherein the first electrode lines do not overlap the second electrode lines, wherein a spacing between each of the first and second electrode lines is greater than a width of the first and second electrode lines respectively.

17. The OLED display device of claim 1, wherein the electrode part comprises a plurality of third electrode lines arranged in parallel, wherein a distance between neighboring third electrode lines is half of an average of the sum of the first and second predetermined intervals.

18. An organic light emitting diode (OLED) display device, comprising:

a panel assembly outputting an image, wherein an edge of the panel assembly includes an electrode part having a plurality of electrode lines arranged in parallel;

a main board that transmits electrical signals to the panel assembly to display the image; and a flexible connection member connecting the main board to the electrode part of the panel assembly, the flexible connection member includes a first end opposite a second end, the connection member includes:

a body part having a plane shape and having a first insulating layer and a second insulating layer stacked on top of one another, a plurality of first electrode lines arranged on the body pan and having a first pitch, and a plurality of second electrode lines arranged within the body part and also having the first pitch, the plurality of second electrode lines being arranged under the first electrode lines, being insulated from the first electrode lines by the first insulating layer, and having one end thereof corresponding to the first end of the connection member being connected to the panel assembly and extending further toward the panel assembly than the first electrode lines, wherein the first insulating layer is absent from the connection member at the first end of the connection member at a location corresponding to where the second electrode lines extend further towards the panel assembly than the first electrode lines, wherein a pitch between the electrode lines of the electrode part being one-half of the first pitch.

19. The OLED display device of claim 18, wherein the first electrode lines are arranged on a Lop side of the first insulating layer, the second electrode lines being arranged on a top side of the second insulating layer, the second electrode lines being covered, by the first insulating layer except at a location corresponding to the first end of the connection member where the second electrode lines extend further towards the panel assembly than the first electrode lines.

20. An organic light emitting diode (OLED) display device, comprising:

a panel assembly outputting an image, wherein an edge of the panel assembly includes an electrode part having a plurality of electrode lines arranged in parallel;

a main board that transmits electrical signals to the panel assembly to display the image; and a flexible connection member connecting the main board to the electrode part of the panel assembly, the flexible connection member includes a first end opposite a second end, the connection member includes:

a body part having a plane shape and having a first insulating layer and a second insulating layer stacked on top of one another, a plurality of first electrode lines arranged on the body part and having a first pitch, and a plurality of second electrode lines arranged within the body part and also having the first pitch, the plurality of second electrode lines being arranged under the first electrode lines, being insulated from the first electrode lines by the first insulating layer, and having one end thereof corresponding to the first end of the connection member being connected to the panel assembly and extending further toward the panel assembly than the first electrode lines, wherein the first insulating, layer is absent from the connection member at the first end of the connection member at a location corresponding to where the second electrode lines extend further towards the panel assembly than the first electrode lines, wherein a pitch between the electrode lines of the electrode part being one-half of the first pitch, wherein each of the first and second electrode lines are wire bonded to the electrode lines of the electrode part.

\* \* \* \* \*